United States Patent [19]
Nagata

[11] Patent Number: 5,432,744
[45] Date of Patent: Jul. 11, 1995

[54] DYNAMIC SEMICONDUCTOR MEMORY CIRCUIT

[75] Inventor: Kyoichi Nagata, Tokyo, Japan

[73] Assignee: NEC Corporation, Tokyo, Japan

[21] Appl. No.: 162,272

[22] Filed: Dec. 7, 1993

[30] Foreign Application Priority Data

Dec. 7, 1992 [JP] Japan .................................. 4-326366

[51] Int. Cl.$^6$ ............................................. G11C 29/00
[52] U.S. Cl. ................... 365/201; 365/230.06
[58] Field of Search ........................... 365/201, 230.06; 371/21.1, 21.4; 324/523, 527

[56] References Cited

U.S. PATENT DOCUMENTS 4,906,994  3/1990  Hoffmann et al. ............. 365/201 X
5,289,475  2/1994  Slemmer ......................... 365/201 X Primary Examiner—Joseph A. Popek
Attorney, Agent, or Firm—Sughrue, Mion, Zinn, Macpeak & Seas

[57] ABSTRACT

A dynamic semiconductor memory circuit, having simultaneous select means composed of inverters and logic gates is provided. The simultaneous select means functions to simultaneously activate multiple drive circuits when a test mode signal TST is activated, therefore simultaneously selecting n word lines and reducing the time to perform a data hold test.

9 Claims, 5 Drawing Sheets

DYNAMIC SEMICONDUCTOR MEMORY CIRCUIT

BACKGROUND OF THE INVENTION

Field of the Invention

The present invention relates to a dynamic semiconductor memory circuit, and more particularly to a dynamic memory circuit having a number of memory cells each with predetermined data hold characteristics.

Description of the Prior Art

Due to the capacitive nature of the memory cells in a dynamic memory circuit, the circuit must be periodically refreshed in order to maintain a predetermined charge level in the cells. The refresh operation is usually performed by reading and amplifying data corresponding to the electric charge stored in the capacitive element, and rewriting the information into the memory cell by supplying another electric charge, representative of the same data, to the same capacitive element. The time interval between refreshes without data loss is referred to as "data hold time". For example, a dynamic random access memory circuit (DRAM) of 16 Mbit with a required 2K refreshes per refresh cycle at an upper operational temperature limit of 70° C. has a standard data hold time of 32 ms. The number of required refreshes per refresh cycle is dependent upon the number of memory cells in the circuit. As the number of cells increases, the number of refreshes increases and consequently, the required data hold time increases. If the number of refreshes is increased to 4K refreshes per cycle, the data hold time is 64 ms. Since data hold characteristics depend on leak current in a junction portion of the memory cell, temperature is an important factor and, in general, data hold time doubles when temperature decreases by 10° C. Therefore, when a data hold test is performed at normal temperature (20° C.), the required time greatly increases.

Generally, there are two types of data hold tests, a static test and a disturb test. In the static test, data is merely written into all memory cells, held therein while all circuit operations are stopped, and then read back for comparison to the original data. In the disturb test, a certain cell is tested by writing data into that cell, and "disturbing" nearby memory cells by driving their word and bit lines to select and non-select levels while the tested memory cell is holding the data. The held data is then read back to determine the influence of the level switching of other memory cells, on the memory content of the tested memory cell.

The static test determines whether data is correctly written, by writing data into all memory cells, holding the data and reading it, as mentioned above. Since the required test time is the sum of the data hold time and the data write and read times, it is proportional to the data hold time. In the case of the above mentioned 16 Mbit DRAM, the standard data hold time of the memory with 4K refreshes is 64 ms at 70° C. Considering the fact that the data hold time doubles with a temperature reduction of 10° C., data hold times of about 2 seconds at normal temperature (20° C.) are not uncommon. It is therefore necessary to verify by testing, that data can be held for 3.0 seconds, considering a safety margin of 1.5 times. When the time necessary to write or read data to or from a memory cell is 200 ns, the write and read times for a memory of 16 Mbit are each 200 (ns)×16 (Mbits)=3.2 (s). In order to write and read both true and false (0,1) signals, each write and read operation must be performed twice. Therefore, the total write and read time becomes 4×3.2(s)=12.8 seconds. The total test time for a 3.0 second data hold time becomes 18.8 seconds, where two 3-second hold times are included. As memory sizes increase, this total test time also increases and test times of several tens of seconds are not uncommon.

In the disturb test the required test time is proportional to memory capacity. That is, since the test in the disturb test is performed for all word lines, test time becomes (data hold time)×(number of word lines).

For example, a disturb test for a 16 Mbit DRAM with 4K refreshes at normal temperature (20° C.) with a data hold time of 3.0 seconds and a cycle time of 200 ns, will be now examined. In the disturb test, all memory cells must be refreshed for every data hold (i.e., each word line). Thus, one word line test time is 200 (ns)×4 (K cycles)+3.0(second) which is about 3.0 seconds. Therefore, a total test time becomes [200 (ns)×4 (K cycles)+3.0 (s)]×4 (K cycles)+3.2×2=12009.4 seconds (about 3 hours 20 minutes), where write time and read time are each 3.2 seconds. This total test time is doubled when both 1's and 0's are tested, and therefore becomes 24018.18 seconds (about 6 hours 40 minutes). This test time is very long compared with that of the static test.

SUMMARY OF THE INVENTION

Therefore, an object of the present invention is to provide a dynamic semiconductor memory circuit capable of reducing the test time, particularly, the time required for a disturb test.

A dynamic semiconductor memory circuit according to the present invention comprises a plurality of word lines grouped into a plurality of word line groups, where each word line group has its own drive circuit. Each drive circuit drives one of the word lines in its corresponding word line group to an active level according to the requested address. A decode circuit activates one drive circuit at a time, according to the requested address, during normal operation. During test mode operation, the decode circuit activates a plurality of drive circuits at one time so that numerous word line groups can be simultaneously tested.

BRIEF DESCRIPTION OF THE DRAWINGS

The abovementioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

A data hold disturb test will be described with reference to FIGS. 1(a) and 1(b) by taking a folded bit line system as an example.

Mutually adjacent memory cells MC1-MC5 on each bit line BL1 and BL2 have been written with high level data and low level data alternatively. Every memory cell connected to a given word line WL1-WL6 is written with data of the same level. Therefore, a write data pattern in the memory cell array becomes striped in parallel to the word lines during testing.

Figure 1B:
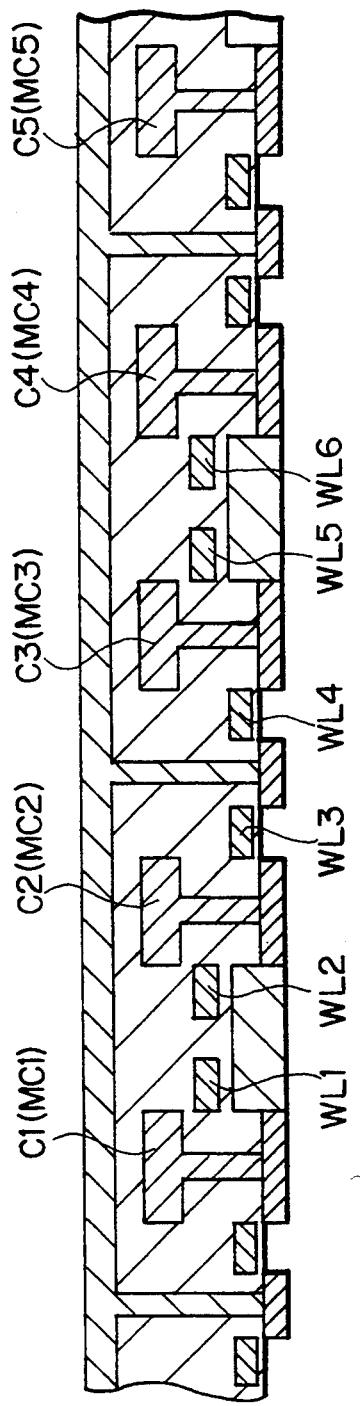
FIG. 1(a) and 1(b) are plan and cross sectional views showing a portion of a memory cell array, respectively, to explain a disturb test.

As shown in FIG. 1(b), there are capacitance elements C1-C5 in the memory cells, in proximity to the respective word lines WL1-WL6. In the disturb test, when a leak current for a certain memory cell, for example, the memory cell MC2, is to be tested, the word line WL2 or WL4 is activated. That is, when the word line WL2 is activated, a parasitic transistor having the line WL2 as a gate electrode and the memory cells MC1 and MC2 as a source and drain electrode is formed. Under this condition, leak current of a certain memory cell is measured by maintaining the certain word line activated for a data hold time (for example, 3 seconds).

In the conventional disturb test, the word lines are activated one by one. According to this invention it has been found that, in the disturb test, a test result similar to that obtainable in the conventional test can be obtained even if a plurality of word lines are activated simultaneously, resulting in a substantial reduction of test time.

Figure 1A:
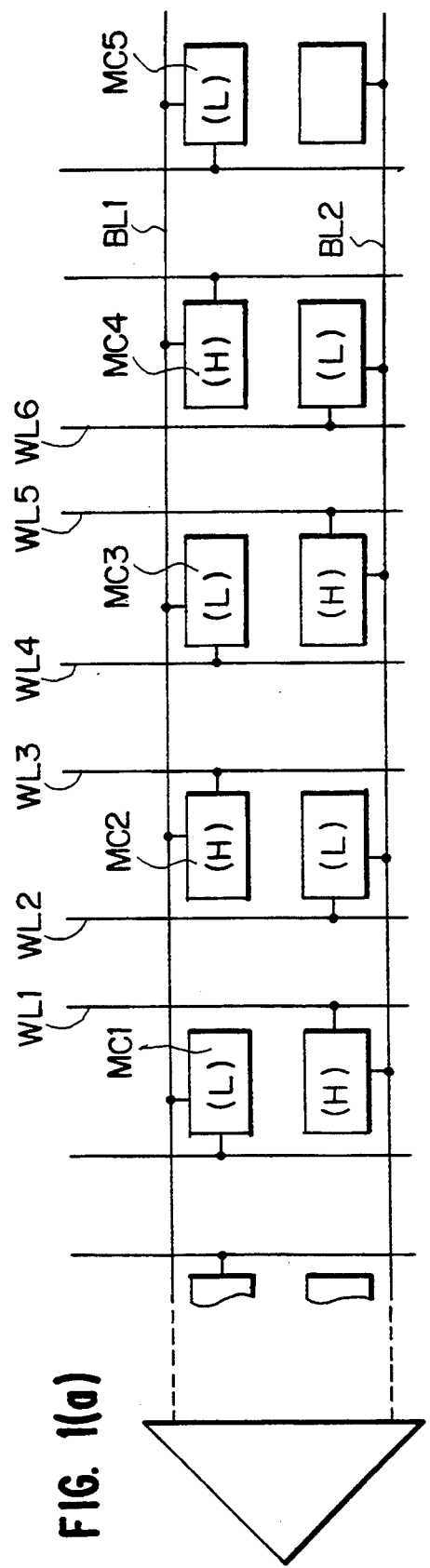

As shown in FIG. 1(a), the adjacent memory cells connected to bit lines BL1 and BL2 are written with data in high level and in low level alternatively. Further, all memory cells connected to one word line are written with data of the same level and memory cells connected to every second word line are written with data of the same level.

When a large leakage current is produced due to the influence of memory cells onto a nearby word line, the contents of the memory cells may be changed. Therefore, it is possible to detect defects in the memory cells if the data read back, after all other word lines are selected, is different from the data written.

In this embodiment, all of the memory cells connected to one of the paired bit lines BL1 and BL2 are selected by making every fifth word line (in this embodiment, WL2, WL6) high simultaneously, and thus it becomes possible to measure leak current between respective memory cells. The conventional DRAM in which four word lines are considered as one unit can be used to realize the above mentioned operation easily. Although all of the memory cells connected to a word line WL2, WL4, or WL6 at a low level are written with the same data, they do not share the same bit line. Therefore, the word line WL2 or WL6 and a word line WL4 cannot be selected simultaneously. Hence, this embodiment is limited to word line group sizes of no less than 4 word lines, where one word line per group is activated at a time.

A circuit construction by which a plurality of word lines are activated simultaneously in a test mode will now be described with reference to FIG. 2.

A word line drive power source circuit 2 functions to drive a word line to a select level and has an output signal RA boosted to a source potential Vcc or more, such that there is no loss of write level by a switching transistor of a memory cell when the transistor is turned on by a word line. A decode circuit 12 decodes the output signal of the word line drive power source circuit 2 with an address signal X0, X1 to generate word line select level signals RA0 to RA3. A decode circuit 11 functions to select one of drive circuits 131-13n according to one of address signals X2-Xm. Each of the drive circuits 131 to 13n functions to drive one of its 4 word lines to a select level, according to output signals from the decode circuits 11 and 12. The decode circuits 11 and 12 and the drive circuits 131 to 13n constitute a word line select circuit 1.

In this embodiment, the decode circuit 11 selects one of the drive circuits 131-13n in normal operation, and all drive circuits in test mode. The decode circuit 11 outputs active level signals according to the address signals X2-Xm. Elements of the address signals X2-Xm are inputted into NAND gates G11-G1n, respectively. The resultant combinations are inverted by inverters IV11-IV1n and combined with the common test signal TST in NOR gates G21-G2n.

Figure 2:
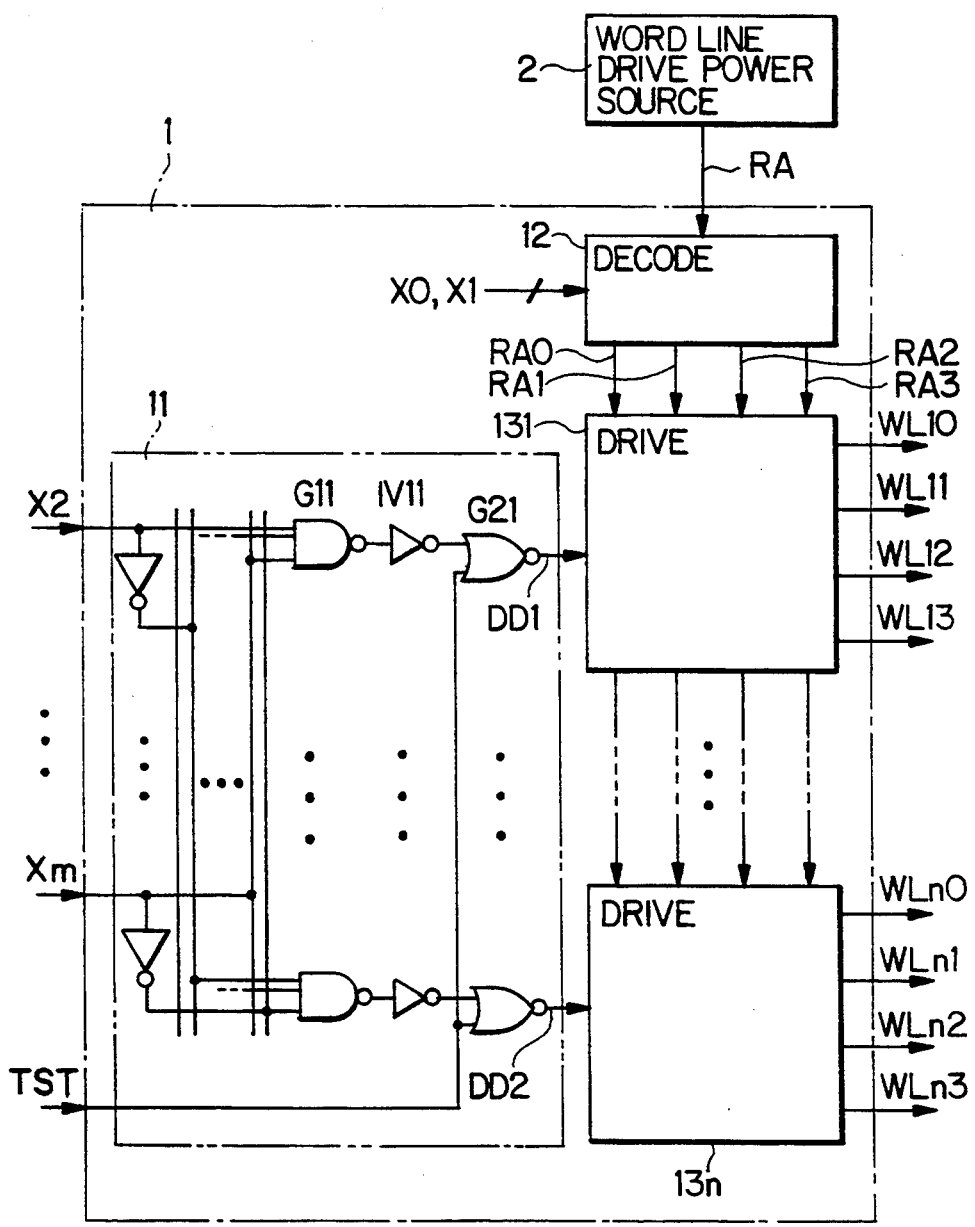
FIG. 2 is a block diagram of a word line select circuit according to a first embodiment of the present invention.
Figure 3:
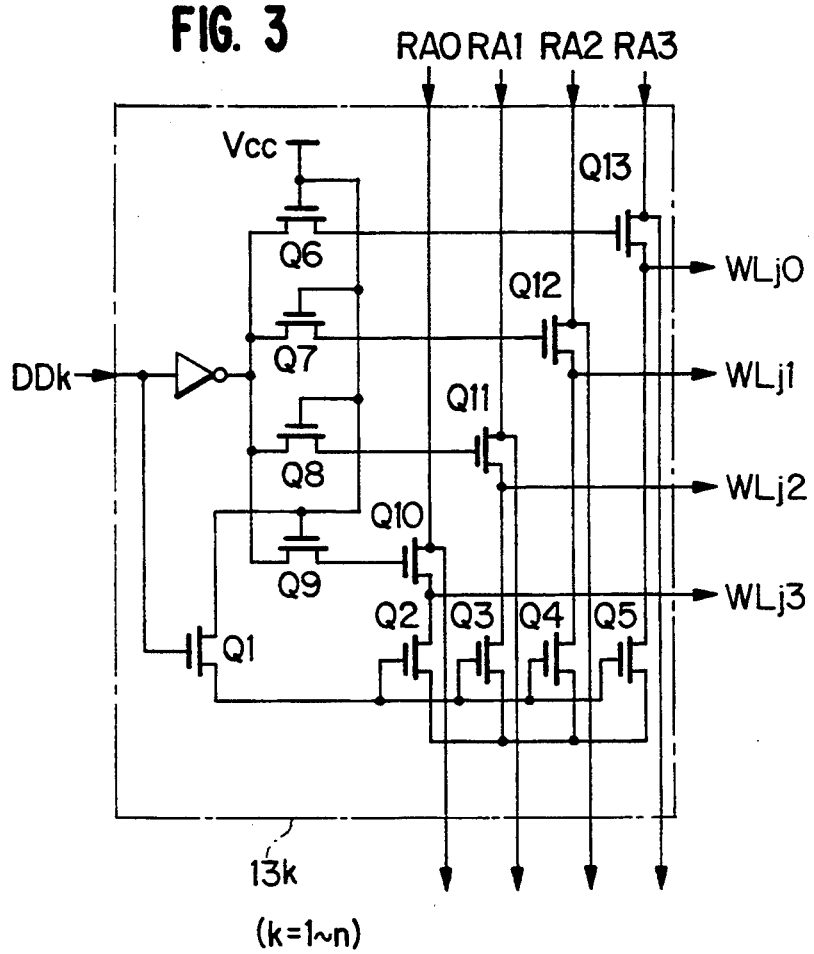
FIG. 3 is a circuit diagram of an example of a drive circuit shown in FIG. 2.

A concrete circuit construction of the drive circuit shown in FIG. 2 is shown in FIG. 3. As is clear from FIG. 3, when DDK supplied from the decode circuit 11 is in an active level, one of the word lines WLj0 to WLj3 becomes activated according to the levels of RA0-RA3.

An operation of the circuit shown in FIG. 2 will now be described. When the test mode signal TST is in an inactive level (low level), the output signals of the logic gates G11-G1n are transmitted as they are to the drive circuits 131-13n through the inverters IV11-IV1n and the logic gates G21-G2n. Therefore, according to the address signals X2-Xm, the output of one of the first logic gates G11-G1n is activated, and hence the corresponding drive circuit 131-13n is activated. The drive circuit thus activated makes one of its 4 word lines active, according to the signals RA0 to RA3. That is, during normal operation, only one of the word lines is activated according to the address signal.

When the test mode signal TST is in an active level, all of the signals DD1-DDn transmitted to the drive circuits 131-13n are in an active level (low level) and therefore all of the drive circuits 131-13n are activated. Hence, one of the four word lines of each of the word line groups is selected according to the signals RA0—RA3 from the decode circuit 12. The word lines are selected sequentially with one fourth of the total being selected simultaneously upon one address input. Thus it is possible to substantially reduce the test time.

The test time will be estimated using the same condition, that is, 16 Mbit DRAM with 4K refreshes. Since all memory cells must be refreshed every hold test in the disturb test, it takes 200 (ns)×4 (K)+3.0 (s) ≈3.0 (s) for one test. Therefore, a test time which further includes write time and read times, each being 3.2 seconds, becomes [200 (ns)×4 (K)+3.0 (S)]×4+3.2×2=18.4 seconds. Further, since this must be done for "1" and "0", the total test time becomes 36.8 seconds. This is substantially shorter than the test time of 6 hours 40 minutes in the conventional method.

Figure 4:
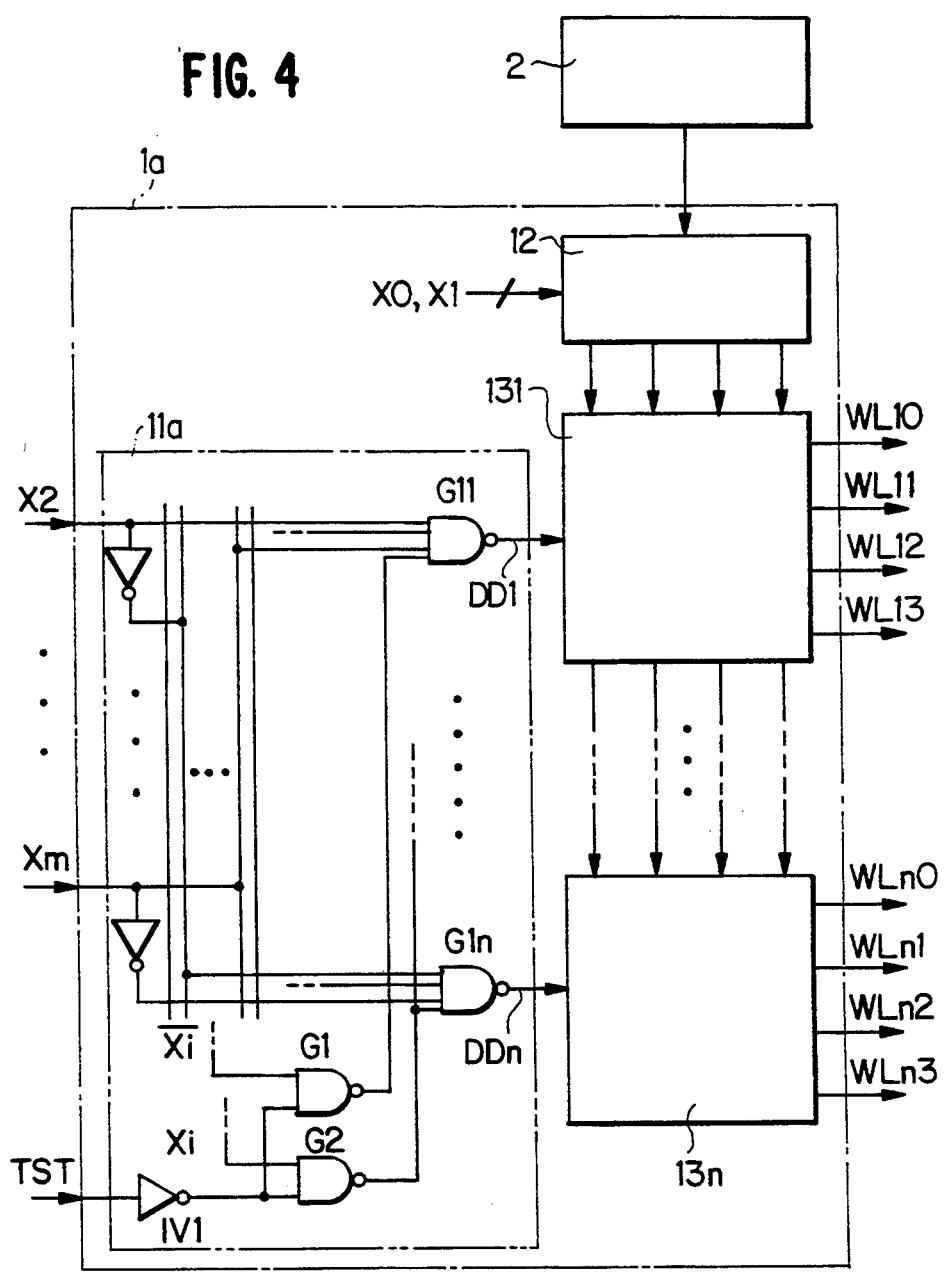
FIG. 4 is a block diagram of a word line select circuit according to a second embodiment of the present invention.

A second embodiment of the present invention will be described with reference to FIG. 4.

This embodiment uses an inverter IV1 and logic gates G1 and G2, along with address bits Xi and its inversion signal to select certain drive circuits when the test mode signal TST is activated.

An operation of this embodiment, when the test mode signal TST is at an inactive level, is the same as that of the first embodiment.

On the other hand, when the test mode signal TST is activated, the outputs of logic gates G1 and G2 are at a high level. Therefore, the output signals of DD1 to DDn of the decode circuit 11a are activated (low level) by other address signals. That is, two of the output signals DD1 to DDn become in the active level. Therefore, only 2 word lines become in the active level.

In the first embodiment, n word lines are selected simultaneously and therefore the word line drive capacity of the word line drive power source circuit 2 must be large enough to drive n word lines. However, since, in the second embodiment, it is enough to drive only two word lines, the word line drive capacity of the word line drive power source circuit 2 can be small. Although the test time becomes longer than that in the first embodiment, it is still one-half of the test time required in the conventional circuit.

Figure 5:
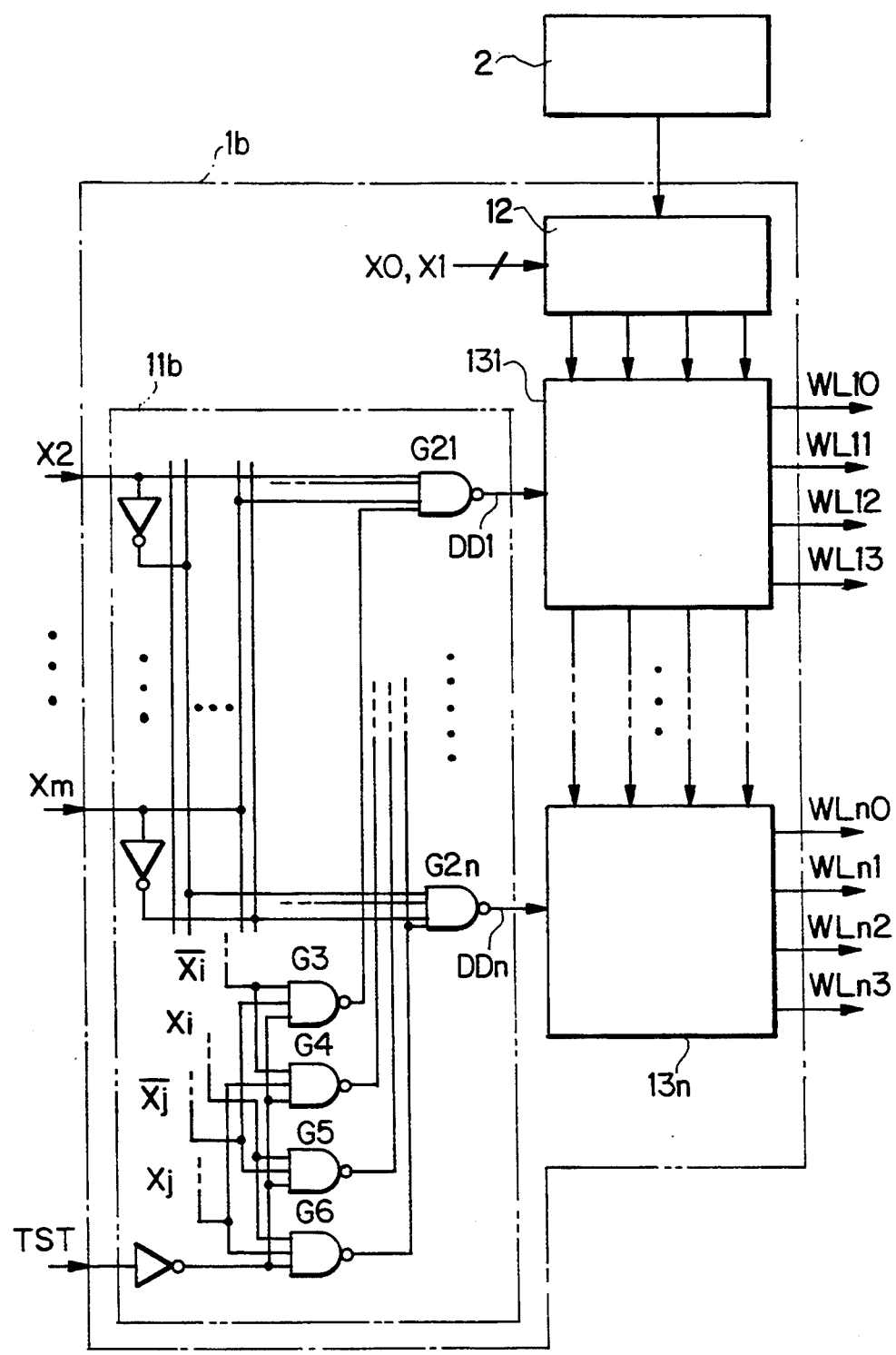
FIG. 5 is a block diagram of a word line select circuit according to a third embodiment of the present invention.

Now, a third embodiment of the present invention will be described with reference to FIG. 5. In this embodiment, there are four address signals to be passed through the simultaneous select means: Xi, Xj and their inversion signals.

An operation of the third embodiment is the same as that of the second embodiment, however, the third embodiment simultaneously selects 4 word lines, making the test time one fourth of that in the conventional circuit.

Figure 6:
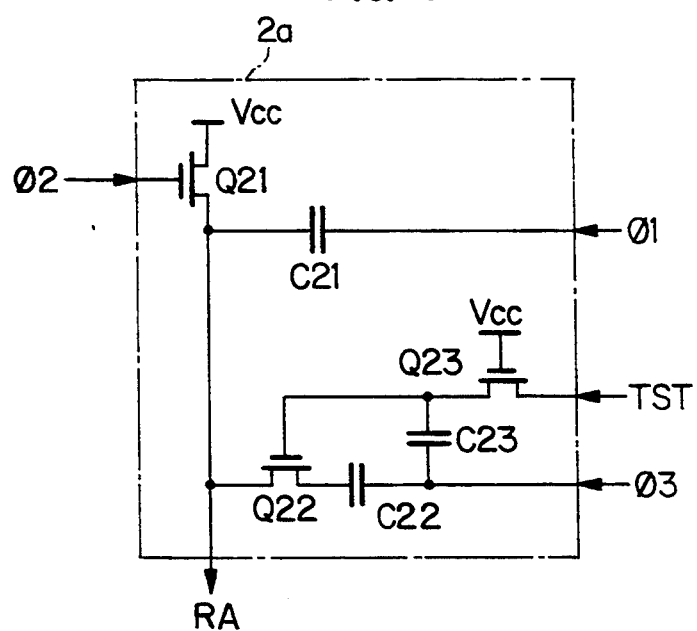
FIG. 6 is a circuit diagram of an example of a word line drive power source circuit in the third embodiment.
Figure 7:
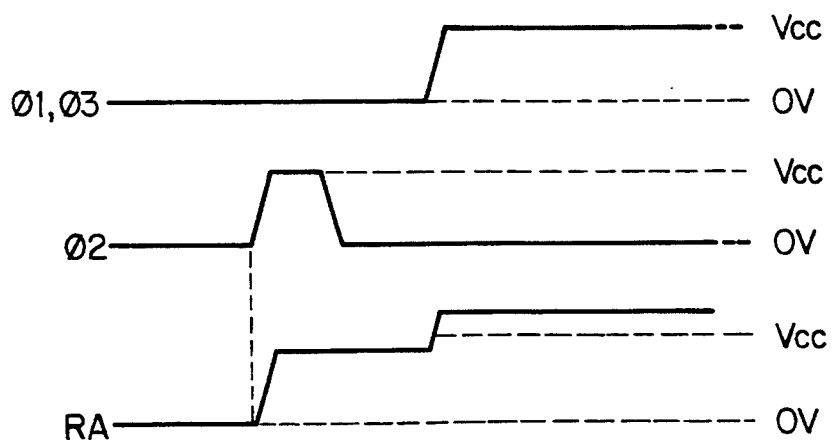
FIG. 7 is a timing diagram of the signals in the circuit shown in FIG. 6.

FIG. 6 is a circuit diagram showing an example of the word line drive power source 2a applicable to the second and third embodiments, and FIG. 7 shows signal waveforms in the word line drive power source circuit 2a.

As mentioned above, the test time becomes shorter with an increase of word lines to be driven simultaneously. In order to drive an increased number of word lines, the capacity of the word line drive power source circuit 2a must be increased.

According to the word line drive power source circuit 2a shown in FIG. 6, the drive capacity thereof is increased by providing a select level boosting means composed of capacitors C22 and C23, and operable to increase the select level voltage to the word line when the test mode signal TST is in the active level. That is, in order to reliably make the word line in the select level, that is, high level, a second boost signal $\phi3$ is input in parallel to the usual boost signal $\phi1$ when the test mode is started so that the word line drive capacity is increased by an amount corresponding to the boost signal $\phi3$.

As described herein, the present invention provides a simultaneous select means for selecting a plurality of word lines simultaneously during the test mode, making it possible to reduce the test time.

What is claimed is:

1. A dynamic semiconductor memory circuit comprising:
   a plurality of word lines grouped into a plurality of word line groups;
   a first decode circuit responsive to a first portion of an address signal for generating a first decode signal;
   a second decode circuit responsive to a second portion of said address signal for generating a second decode signal composed of a plurality of signals;
   a plurality of drive circuits, each responsive to the first decode signal commonly supplied thereto and one of the signals of the second decode signal for activating one of said word lines in each of said word line groups according to the first decode signal when said one of the signals of the second decode signal applied thereto is in the active level; and
   test mode means for making at least two of said signals of said second decode signal active simultaneously when a test mode signal is supplied thereto.

2. The dynamic semiconductor memory circuit claimed in claim 1, wherein said test mode means comprises a plurality of logic gate means supplied with the second decode signals and the test mode signal.

3. The dynamic semiconductor memory circuit claimed in claim 1, wherein said test mode means comprises logic gate means for making all of the second decode signals active upon the test mode signal.

4. A dynamic semiconductor memory circuit comprising:
   a plurality of word lines grouped into a plurality of word line groups;
   a first decode circuit responsive to a first portion of an address signal for generating a first decode signal;
   a second decode circuit responsive to a second portion of said address signal for generating a second decode signal composed of a plurality of signals;.
   a plurality of drive circuits, each responsive to the first decode signal commonly supplied thereto and one of the signals of the second decode signal for activating one of said word lines in each of said word line groups according to the first decode signal when said one of the signals of the second decode signal applied thereto is in the active level; and
   test mode means for making at least two of said signals of said second decode signal active simultaneously when a test mode signal is supplied thereto, said test mode means comprising means responsive to the test mode signal and a portion of the address signal for making active a plurality of said signals of said second decode signal corresponding to the portion of the address signal when the test mode signal is in an active level.

5. A dynamic semiconductor memory circuit comprising:
   a plurality of word lines grouped into a plurality of word line groups;
   a plurality of drive circuits provided corresponding to said word line groups for making one of the word lines in said one word line group in the active level when an activation signal is in the active level; and
   a decode circuit for making only one signal active according to an address signal during a normal operation and supplying the active signal as the activation signal, and making a plurality of signals active during a test mode and supplying said plurality of signals as the activation signals.

6. A dynamic semiconductor memory circuit including:
   a memory cell array having a plurality of memory cells arranged in rows and columns;

a plurality of word lines, each connected to said plurality of memory cells in one of said rows;

a plurality of bit lines, each connected to the plurality of memory cells in one of said columns, for transferring data to and from said memory cells in said column;

a word line select circuit for making one of the plurality of said word lines in the select level according to an address signal;

a word line drive power source portion for generating a voltage corresponding to the select level for said word lines; and simultaneous select means provided in said word line select circuit, said simultaneous select means being adapted to make at least two of the plurality of said word lines in the select level simultaneously when a test mode signal is in the active level.

7. A dynamic semiconductor memory circuit comprising:

a memory cell array having a plurality of memory cells arranged in rows and columns;

a plurality of word lines, each connected to said plurality of memory cells in one of said rows;

a plurality of bit lines, each connected to the plurality of memory cells in one of said columns, for transferring data to and from said memory cells in said column;

a word line select circuit for making one of the plurality of said word lines in the select level according to an address signal;

a word line drive power source portion for generating a voltage corresponding to the select level for said word lines; and simultaneous select means provided in said word line select circuit, said simultaneous select means being adapted to make at least two of the plurality of said word lines in the select level simultaneously when a test mode signal is in the active level, wherein said word line select circuit comprises:

a plurality of first logic gates corresponding to the plurality of said respective word lines, said first logic gates being adapted to become in the active level according to the address signal transmitted thereto and output a signal for making a corresponding word line in the select level;

a plurality of second logic gates corresponding to the plurality of said first logic gates for making output terminals of said second logic gates in an active level when the test mode signal is in an active level and transferring output signals of said corresponding first logic gates to said output terminal when the test mode signal is in the inactive level; and a plurality of drive circuits corresponding to the plurality of said second logic gates for making corresponding word lines in a select level when the output signal of the plurality of said corresponding second logic gates is in the active level.

8. (Amended) A dynamic semiconductor memory circuit comprising:

a memory cell array having a plurality of memory cells arranged in rows and columns;

a plurality of word lines, each connected to said plurality of memory cells in one of said rows;

a plurality of bit lines, each connected to the plurality of memory cells in one of said columns, for transferring data to and from said memory cells in said column;

a word line select circuit for making one of the plurality of said word lines in the select level according to an address signal;.

a word line drive power source portion for generating a voltage corresponding to the select level for said word lines; and simultaneous select means provided in said word line select circuit, said simultaneous select means being adapted to make at least two of the plurality of said word lines in the select level simultaneously when a test mode signal is in the active level, wherein said word line select circuit comprises:

a plurality of first logic gates corresponding to said plurality of word lines, said first logic gates being adapted to become in the active level according to the address signal transmitted thereto and output a signal for making a corresponding word line in the select level;

a second logic gate for fixing predetermined bits of an input address signal to an active level when the test mode signal is in an active level and for passing the test mode signal to a corresponding one of said first logic gates when the test mode signal is in the inactive level; and a plurality of drive circuits corresponding to said plurality of first logic gates for making a corresponding one of said word lines in a select level when the output signal of said first logic gate is in an active level.

9. The dynamic semiconductor memory circuit claimed in claim 6, wherein said word line drive power source portion includes select supply capacity increasing means for increasing supply capacity of select level voltage to be supplied to the word line when the test mode signal is in an active level.

* * * * *

UNITED STATES PATENT AND TRADEMARK OFFICE
CERTIFICATE OF CORRECTION

PATENT NO. : 5,432,744
DATED : July 11, 1995
INVENTOR(S) : Kyoichi NAGATA

It is certified that error appears in the above-indentified patent and that said Letters Patent is hereby corrected as shown below:

Col. 8, line 8, delete "(Amended)"

Signed and Sealed this

Tenth Day of October, 1995

Attest:

BRUCE LEHMAN

Attesting Officer        Commissioner of Patents and Trademarks